United States Patent
Lei et al.

(10) Patent No.: US 8,653,526 B1
(45) Date of Patent: Feb. 18, 2014

(54) DISPLAY PANEL

(71) Applicant: AU Optronics Corporation, Hsin-Chu (TW)

(72) Inventors: Chen-Yuan Lei, Hsin-Chu (TW); Meng-Chieh Tsai, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 13/832,743

(22) Filed: Mar. 15, 2013

(30) Foreign Application Priority Data

Oct. 24, 2012 (TW) .............................. 101139282 A

(51) Int. Cl.
| | |
|---|---|
| *H01L 29/04* | (2006.01) |
| *H01L 29/10* | (2006.01) |
| *H01L 31/036* | (2006.01) |
| *H01L 31/0376* | (2006.01) |
| *H01L 31/20* | (2006.01) |
| *H01L 29/15* | (2006.01) |

(52) U.S. Cl.
USPC .. 257/59; 257/72; 257/E27.13; 257/E27.131; 257/E27.133

(58) Field of Classification Search
USPC .......... 257/59, 72, E27.13, E27.131, E27.133
See application file for complete search history.

(56) References Cited

U.S. PATENT DOCUMENTS

| | | | |
|---|---|---|---|
| 6,661,476 B1 | 12/2003 | Abe et al. | |
| 7,141,517 B2 * | 11/2006 | Kawaguchi et al. | 438/795 |
| 7,199,853 B2 | 4/2007 | Koide | |
| 7,378,739 B2 * | 5/2008 | Kwak et al. | 257/758 |
| 7,425,730 B2 * | 9/2008 | Lee et al. | 257/98 |
| 7,486,357 B2 | 2/2009 | Jang et al. | |
| 7,872,264 B2 * | 1/2011 | Kubota et al. | 257/72 |
| 2005/0218409 A1 * | 10/2005 | Um et al. | 257/72 |
| 2010/0224880 A1 * | 9/2010 | Kimura | 257/59 |
| 2012/0256177 A1 * | 10/2012 | Yamazaki | 257/43 |
| 2013/0095588 A1 * | 4/2013 | Kimura et al. | 438/34 |
| 2013/0221350 A1 * | 8/2013 | Yamazaki et al. | 257/43 |
| 2013/0240842 A1 * | 9/2013 | Rinzler et al. | 257/40 |

\* cited by examiner

*Primary Examiner* — Ida M Soward
(74) *Attorney, Agent, or Firm* — WPAT, PC; Justin King

(57) ABSTRACT

A display panel having a display area and a gate driving area includes a gate line and plural pixel units in the display area, and a gate driver circuit in the gate driving area. The gate line connects to the pixel units. The gate driver circuit connects to the gate line. The gate driver includes a driving transistor and a driving storage capacitor stacked to each other to form a stack structure, which includes a first electrode, a first dielectric layer, a second electrode, a second dielectric layer, a first semiconductor layer, a drain electrode, and a source electrode, which is connected to the gate line. The driving storage capacitor is formed by the first electrode, the first dielectric layer, and the second electrode. The driving transistor is formed by the second electrode, the second dielectric layer, the first semiconductor layer, the source electrode, and the drain electrode.

15 Claims, 7 Drawing Sheets

DISPLAY PANEL

RELATED APPLICATIONS

This application claims priority to Taiwan Application Serial Number 101139282, filed Oct. 24, 2012, which is herein incorporated by reference.

BACKGROUND

1. Technical Field

The present disclosure relates to a display panel. More particularly, the present invention relates to a display panel with the gate driver on array technology.

2. Description of Related Art

In general, a display panel includes a display area and a non-display area, i.e. the border area. There are plural pixel units for displaying images in the display area. Therefore, the size of the image generated from the pixel units depends on the size of the display area, and the larger display area presents the larger image. There are plural wires cooperated with pixel units in the non-display area, which generally forms the border of the display panel. With the increasing amount of the wires, the border needs larger area in the display panel which occupies the display area of the display panel.

Along with the consumer electronic products getting compact, the display panels need to be reduced in size. Therefore, in order to obtain a border area of the display panel as narrow as possible, the Gate Driver on Array (GOA) technology has been applied to the display panel. Accordingly, the border area of the display panel applying GOA technology can be further reduced so as to expand the proportion of the display area in the display panel. However, it is still an issue of how to further reduce the border area to provide an even larger display area of the display panel.

SUMMARY

A display panel having a display area and a gate driving area includes at least one gate line, a plurality of pixel units, and a gate driver circuit. The gate line and the pixel units are disposed in the display area, and the gate line is connected to the pixel units. The gate driver circuit is disposed in the gate driving area and connected to the gate line. The gate driving circuit includes a driving transistor and a driving storage capacitor stack to each other to form a stack structure. The stack structure includes a first electrode, a first dielectric layer, a second electrode, a second dielectric layer, a first semiconductor layer, a source electrode, and a drain electrode. The first electrode is connected to the gate line for being as a bottom electrode of the driving storage capacitor. At least one portion of the second electrode overlaps the first electrode. At least one portion of the first dielectric layer is disposed between the second electrode and the first electrode. The second electrode is for being as a gate electrode of the driving transistor and a top electrode of the driving storage capacitor. The driving storage capacitor is formed by the first electrode, the first dielectric layer, and the second electrode. At least one portion of the first semiconductor layer overlaps the second electrode. At least one portion of the second dielectric layer is disposed between the second electrode and the first semiconductor layer. The source electrode and the drain electrode are disposed apart from each other, and connected to the first semiconductor layer respectively. The source electrode is connected to the gate line. The driving transistor is formed by the second electrode, the first semiconductor layer, the source electrode, and the drain electrode.

In one or more embodiments, the second electrode is optionally disposed above the first electrode, and the first semiconductor layer is optionally disposed above the second electrode.

In one or more embodiments, the second electrode is optionally disposed above the first semiconductor layer, and the first electrode is optionally disposed above the second electrode.

In one or more embodiments, the gate line and the first electrode are both optionally composed by a first metal layer, the source electrode of the driving transistor and the drain electrode of the driving transistor are both optionally composed by a second metal layer, and the second electrode is optionally composed by a third metal layer.

In one or more embodiments, the third metal layer is optionally disposed between the first metal layer and the second metal layer.

In one or more embodiments, each of the pixel units optionally includes a pixel transistor and a pixel storage capacitor connected to each other. The pixel storage capacitor optionally includes a third electrode, a fourth electrode, and a dielectric layer. The third electrode and the second electrode are both optionally composed by a third metal layer without connecting to each other. The dielectric layer is disposed between the third electrode and the fourth electrode.

In one or more embodiments, the fourth electrode of the pixel storage capacitor, the source electrode of the driving transistor, and the drain electrode of the driving transistor are all optionally composed of a second metal layer.

In one or more embodiments, the pixel transistor optionally includes a pixel gate electrode, a second semiconductor layer, a pixel dielectric layer, a pixel source electrode, and a pixel drain electrode. The pixel gate electrode is connected to the gate line. The pixel dielectric layer is disposed between the pixel gate electrode and the second semiconductor layer. The pixel source electrode and the pixel drain electrode are disposed apart from each other and connected to the second semiconductor layer respectively. The pixel drain electrode is connected to the fourth electrode of the pixel storage capacitor.

In one or more embodiments, the pixel gate electrode, the gate line, and the first electrode are all optionally composed by a first metal layer.

In one or more embodiments, the pixel source electrode, the pixel drain electrode, the fourth electrode of the pixel storage capacitor, the source electrode of the driving transistor, and the drain electrode of the driving transistor are all optionally composed by a second metal layer.

In one or more embodiments, the first semiconductor layer of the driving transistor and the second semiconductor layer of the pixel transistor are both optionally composed by a semiconductor layer.

In one or more embodiments, the pixel drain electrode of the pixel transistor is optionally further connected to a pixel electrode.

In one or more embodiments, the gate driving circuit optionally further includes a scan sequence signal generation for providing a scan sequence signal of the gate driving circuit.

In one or more embodiments, the gate driving circuit optionally further includes a first clock and a second clock. The first clock is connected to the drain electrode of the driving transistor, and the second clock is connected to the source electrode of the driving transistor.

In one or more embodiments, the phase difference between the signal of the first clock and the signal of the second clock is optionally 180 degrees.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
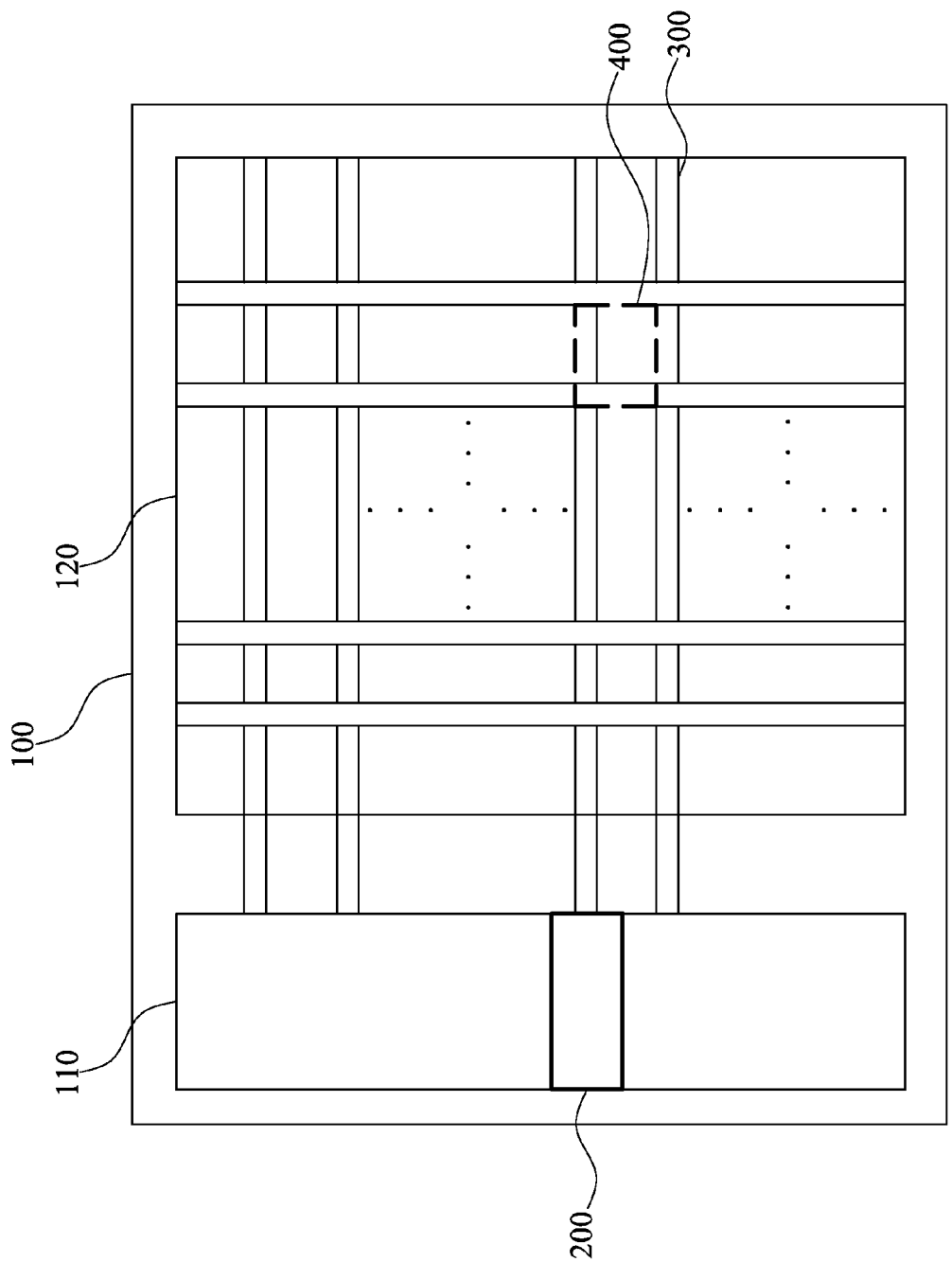
FIG. 1 is a schematic diagram of a display panel according to one embodiment of the present invention.

FIG. 1 is a schematic diagram of a display panel 100 according to one embodiment of the present invention. The display panel 100 having a gate driving area 110 and a display area 120 is a display panel with the gate driver on array (GOA) technology. The display panel 100 includes a gate driving circuit 200 disposed in the gate driving area 110, and at least a gate line 300 and a plurality of pixel units 400 all disposed in the display area 120. The gate line 300 is connected to the pixel units 400 and the gate driving circuit 200, such that the gate driving circuit 200 can drive the pixel units 400 through the gate line 300. It should be understood that the top view design of the display panel 100 of FIG. 1 is only illustrative, and should not limit the scope of the claimed invention. A person having ordinary skill in the art may design a proper circuit for the display panel 100 according to actual requirements.

Figure 2:
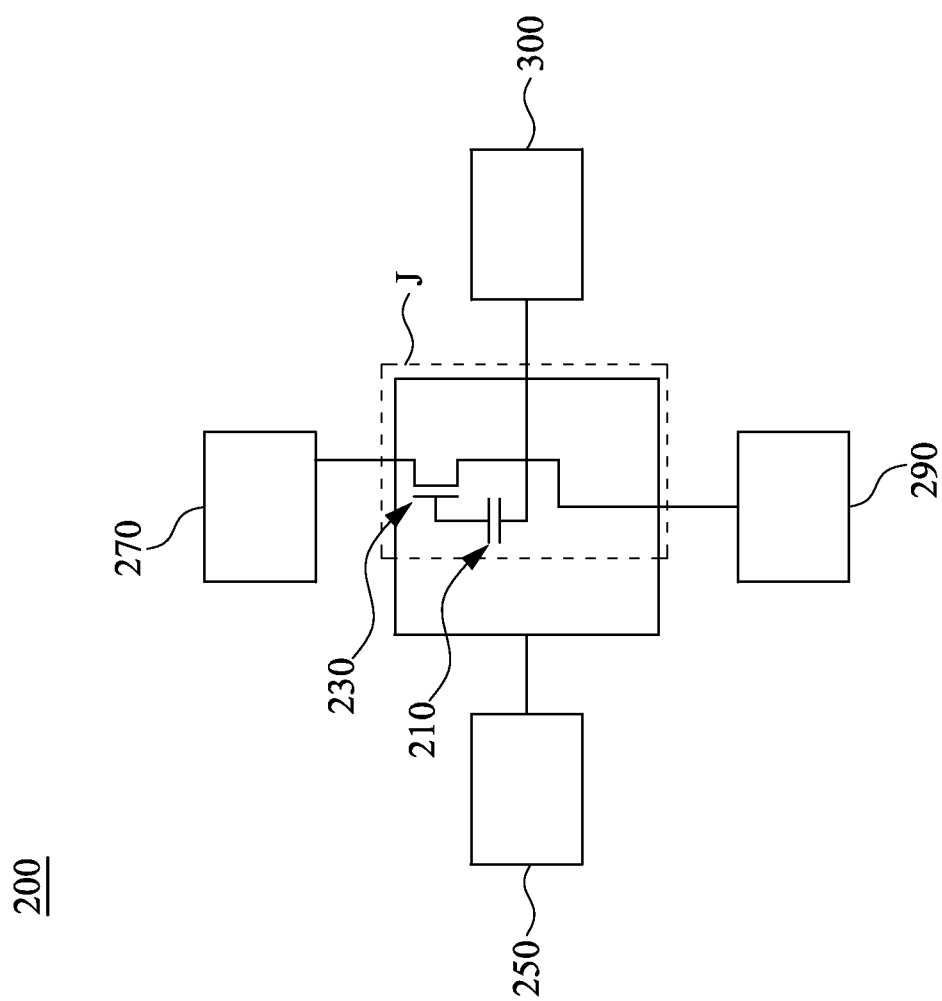
FIG. 2 is an equivalent circuit of the gate driving circuit of FIG. 1.
Figure 3:
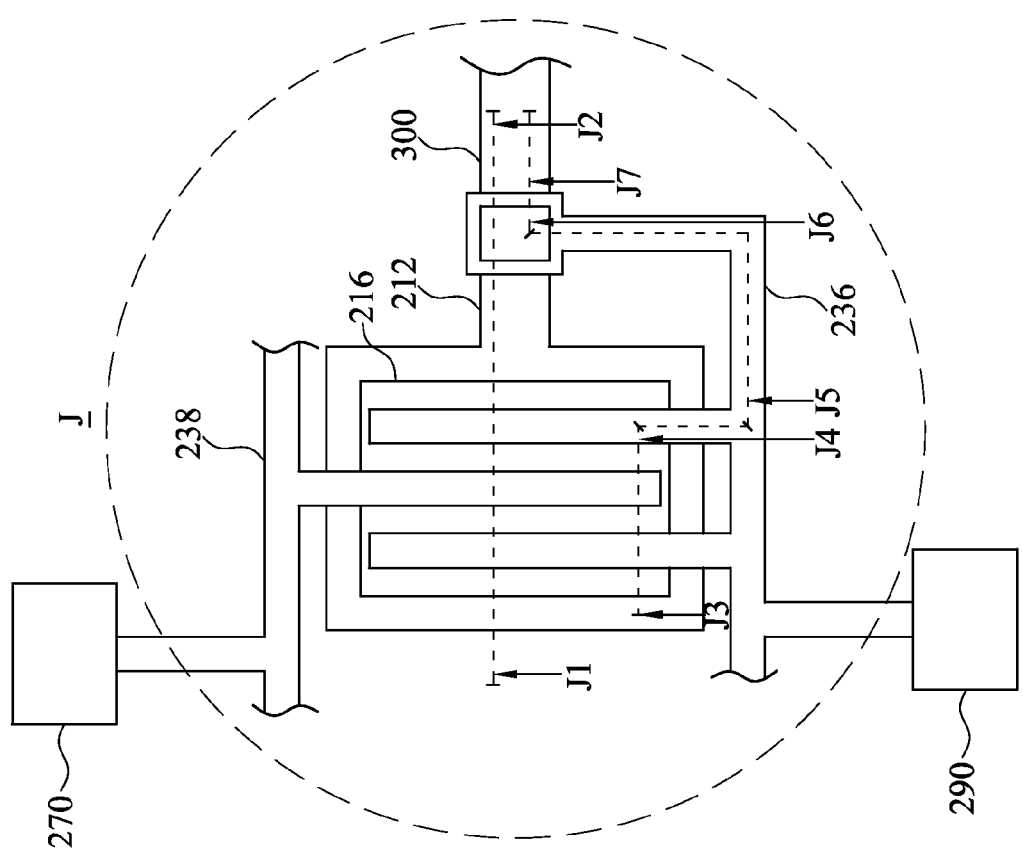
FIG. 3 is a top view of the area J of FIG. 2.

FIG. 2 is an equivalent circuit of the gate driving circuit 200 of FIG. 1. FIG. 3 is a top view of the area J of FIG. 2. The gate driving circuit 200 includes a driving storage capacitor (or namely first capacitor) 210 and a driving transistor (or namely first transistor) 230. The driving storage capacitor 210 and the driving transistor 230 form a stack structure, as shown in FIG. 3. More specifically, the driving storage capacitor 210 and the driving transistor 230 stack to each other in a vertical directional. In other words, the driving transistor 230 and the driving storage capacitor 210 are in the same position in FIG. 3. Therefore, the layout area of the circuit in the display panel 100 can be reduced.

Figure 4:
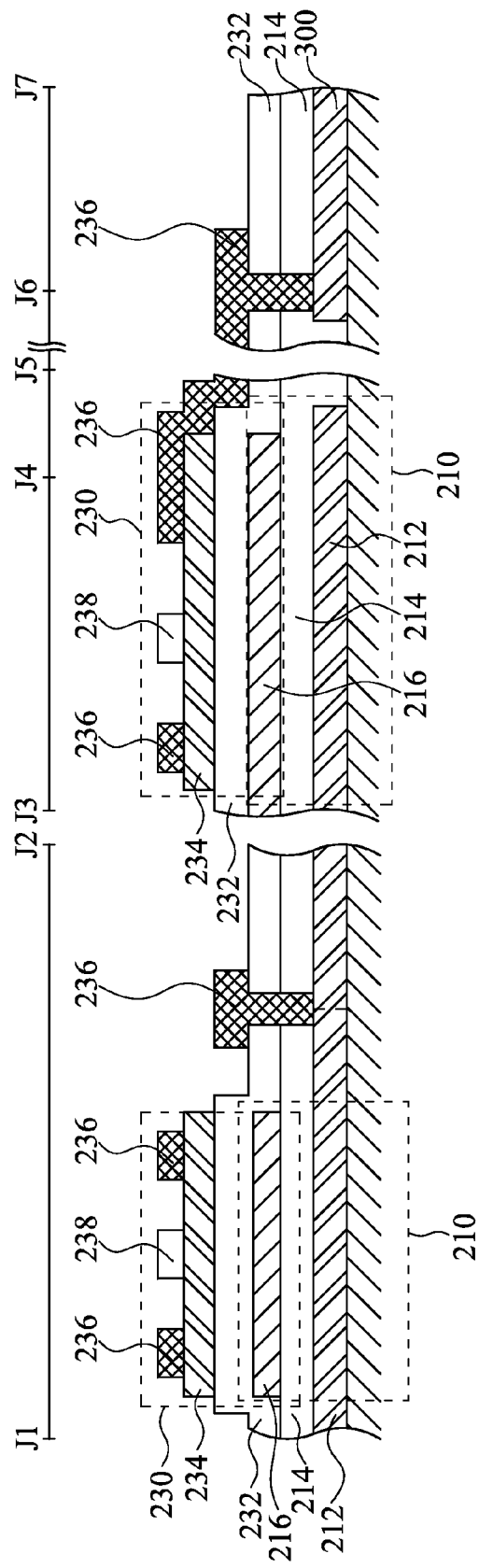
FIG. 4 is a cross-section view along lines J1-J2 and J3-J7 of FIG. 3.

FIG. 4 is a cross-section view along lines J1-J2 and J3-J7 of FIG. 3. The stack structure includes a first electrode 212, a first dielectric layer 214, a second electrode 216, a second dielectric layer 232, a first semiconductor layer 234, a source electrode 236, and a drain electrode 238. The first electrode 212, the first dielectric layer 214, and the second electrode 216 are compounded (or namely formed) to be the driving storage capacitor 210, and the second electrode 216, the second dielectric layer 232, the first semiconductor layer 234, the source electrode 236, and the drain electrode 238 are compounded (or namely formed) to be the driving transistor 230. More specifically, the first electrode 212 is connected to the gate line 300, and the first electrode 212 is for being as a bottom electrode of the driving storage capacitor 210. At least one portion of the second electrode 216 overlaps the first electrode 212. At least one portion of the first dielectric layer 214 is disposed between the first electrode 212 and the second electrode 216. The second electrode 216 is for being as a top electrode of the driving storage capacitor 210 and a gate electrode of the driving transistor 230. At least one portion of the first semiconductor layer 234 overlaps the second electrode 216. At least one portion of the second dielectric layer 232 is disposed between the second electrode 216 and the first semiconductor layer 234. The source electrode 236 and the drain electrode 238 are disposed apart from each other and connected to the first semiconductor layer 234, respectively. The source electrode 236 also connected to the gate line 300.

Therefore, since the second electrode 216 is not only the gate electrode of the driving transistor 230, but also the top electrode of the driving storage capacitor 210, the driving storage capacitor 210 and the driving transistor 230 can be stack together in the vertical directional, such that the layout area of the gate driving circuit 200 is reduced. On the other hand, for the driving storage capacitor 210, the distance between the first electrode 212, i.e. the bottom electrode of the driving storage capacitor 210, and the second electrode 216, i.e. the top electrode of the driving storage capacitor 210, is shorter than that of the traditional storage capacitor. Since the capacitance is inversely proportional to the distance between the top electrode and the bottom electrode, the driving storage capacitor 210 owns higher capacitance than the traditional storage capacitor under the same electrode area. In other words, the driving storage capacitor 210 provides sufficient capacitance with smaller electrode area relative to that of the traditional storage capacitor. Similarly, for the driving transistor 230, since the distance between the second electrode 216, i.e. the gate electrode of the driving transistor 230, and the first semiconductor layer 234 is reduced, the current per unit area of the driving transistor 230 is increased. In other words, the driving transistor 230 provides sufficient current under smaller area or with less transistor number relative to the traditional transistor. In summary, the layout area of the gate driving circuit 200 with the driving storage capacitor 210 and the driving transistor 230 owns smaller layout area not only because of its stack structure, but also because of the smaller size of the driving storage capacitor 210 and the smaller size or the less number of the driving transistors 230. The fraction of the area reduction is about 30% to about 80% of a general circuit layout area, which owns a driving transistor and a driving storage capacitor disposed apart horizontally rather than stack together vertically (or namely in the vertical directional).

In this embodiment, the driving transistor 230 is a bottom-gate-type transistor. More specifically, the first dielectric layer 214 covers the first electrode 212, i.e. the bottom electrode of the driving storage capacitor 210. The second electrode 216, i.e. the top electrode of the driving storage capacitor 210 and also the gate electrode of the driving transistor 230, is disposed on the first dielectric layer 214 and above the first electrode 212. The second dielectric layer 232 covers the second electrode 216. The first semiconductor layer 234 is disposed on the second dielectric layer 232 and above the second electrode 216. The source electrode 236 and the drain electrode 238 are disposed on the first semiconductor layer 234. In other words, the source electrode 236 is connected to the gate line 300 and the first electrode 212 through a through hole (not marked) penetrating the second dielectric layer 232 and the first dielectric layer 214. Hence, the driving transistor 230 is disposed on the driving storage capacitor 210 as shown in FIG. 4. On the other hand, the position between the first electrode 212 and the gate line 300 at the left-hand side of the cross-section view of FIG. 4, i.e. the position marked with line J1-J2, is a fully film layer connecting the first electrode 212 and the gate line 300, while the position between the first electrode 212 and the gate line 300 at the right-hand side of the cross-section view of FIG. 4, i.e. the position marked with line J5-J6, is a gap, which means the first electrode 212 does not exist in the bottom of the source electrode 236 marked with line J5-J6, as shown in the top view of FIG. 3.

Figure 5:
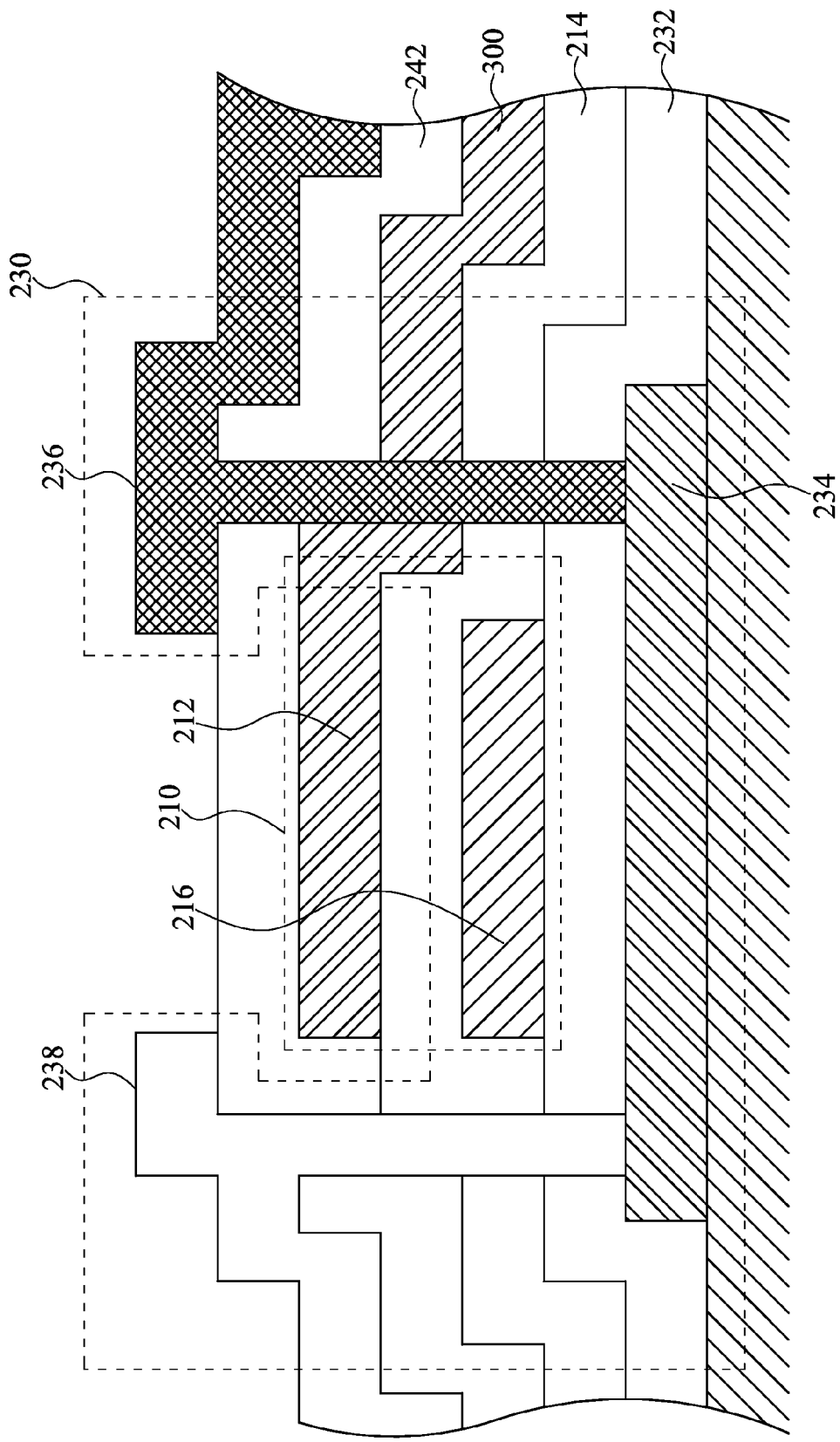
FIG. 5 is a cross-section view of the driving transistor, the driving storage capacitor, and the gate line according to another embodiment of the present invention.

However, the above-mentioned of the structure does not limit the invention. In another embodiments, the driving transistor 230 may be a top-gate-type transistor, as shown in FIG. 5. More specifically, in FIG. 5, the first semiconductor layer 234 is disposed on a substrate. The second dielectric layer 232 covers the first semiconductor layer 234. The second electrode 216, i.e. the electrode of the driving storage capacitor 210 and also the gate electrode of the top-gate-type transistor, is disposed on the second dielectric layer 232 and above the first semiconductor layer 234. The first dielectric layer 214 covers the second electrode 216. The first electrode 212, i.e. the other electrode of the driving storage capacitor 210, is disposed on the first dielectric layer 214 and above the second electrode 216. The source electrode 236 and the drain electrode 238 are disposed above the first electrode 212, and individually connected to the first semiconductor layer 234 via the through holes which are not shown in FIG. 5. In other words, the source electrode 236 is connected to the first semiconductor layer 234 through the through hole (not shown) penetrating the first electrode 212, the second dielectric layer 232, and the first dielectric layer 214. The source electrode 236 is also connected to the first electrode 212 and the gate line 300. The drain electrode 238 is connected to the first semiconductor layer 234 through the other through hole (not shown) penetrating the second dielectric layer 232 and the first dielectric layer 214. The top-gate-type transistor further includes a third dielectric layer 242 disposed between the source electrode 236, the drain electrode 238, and the first electrode 212 to prevent a short circuit due to the connections between the source electrode 236 and the first electrode 212 and/or between the drain electrode 238 and the first electrode 212. A person having ordinary skill in the art may design the stack structure according to actual requirements.

Reference is made back to FIG. 4. The gate line 300 and the first electrode 212 may be both made of a first metal layer. More specifically, a manufacturer may form an overall first metal layer first, and then the gate line 300 and the first electrode 212 may be formed by patterning the first metal layer. However, it should not limit the invention. In one or more embodiments, the materials of the gate line 300 and the first electrode 212 may be different. The first metal layer may be a single layer or a multi-layer structure, and the material of the first metal layer may include metal or metallic compounds. The metal includes titanium (Ti), molybdenum (Mo), chromium (Cr), iridium (Ir), aluminum (Al), copper (Cu), silver (Ag), gold (Au), Zinc (Zn), Indium (In), gallium (Ga), other proper materials, or any combination thereof. The metallic compounds include metal alloys, metal oxide, metal nitride, metal oxide nitride, materials thereof including organic components, other proper materials, or any combination thereof. The methods for making the patterned first metal layer include vapor deposition, lithography and etching, screen printing, ink-jet printing, laser ablation, or other proper methods.

The source electrode 236 and the drain electrode 238 of the driving transistor 230 may be both made of a second metal layer. More specifically, a manufacturer may form an overall second metal layer first. The source electrode 236 and the drain electrode 238 of the driving transistor 230 may be formed by patterning the second metal layer. However, it should not limit the invention. In one or more embodiments, the materials of the source electrode 236 and the drain electrode 238 of the driving transistor 230 may be different. The second metal layer may be a single layer or a multi-layer structure, and the material of the second metal layer may include metal or metallic compounds. The metal includes titanium (Ti), molybdenum (Mo), chromium (Cr), iridium (Ir), aluminum (Al), copper (Cu), silver (Ag), gold (Au), Zinc (Zn), Indium (In), gallium (Ga), other proper materials, or any combination thereof. The metallic compounds include metal alloys, metal oxide, metal nitride, metal oxide nitride, material thereof including organic components, other proper materials, or any combination thereof. The methods for making the patterned second metal layer include vapor deposition, lithography and etching, screen printing, ink-jet printing, laser ablation, or other proper methods.

The second electrode 216 may be made of a third metal layer, where the third metal layer is disposed between the first metal layer and the second metal layer. More specifically, a manufacturer may form an overall third metal layer first. The second electrode 216 may be formed by pattering the third metal layer. However, it should not limit the invention. The third metal layer may be a single layer or a multi-layer structure, and the material of the third metal layer may include metal or metallic compounds. The metal includes titanium (Ti), molybdenum (Mo), chromium (Cr), iridium (Ir), aluminum (Al), copper (Cu), silver (Ag), gold (Au), Zinc (Zn), Indium (In), gallium (Ga), other proper materials, or any combination thereof. The metallic compounds include metal alloys, metal oxide, metal nitride, metal oxide nitride, material thereof including organic components, other proper materials, or any combination thereof. The methods for making the patterned third metal layer include vapor deposition, lithography and etching, screen printing, ink-jet printing, laser ablation, or other proper methods.

The first dielectric layer 214 and the second dielectric layer 232 may be a single layer or a multi-layer structure, and the material thereof may include inorganic materials (for example, silicon nitride, silicon oxide, silicon oxide nitride, or any combination thereof), organic materials (for example, polyimide (PI), polycarbonate (PC), polyethylene terephthalate, polyethylene naphthalate, polypropylene (PP), polyethylene (PE), polystyrene (PS), other proper materials, or the derivates of the compounds aforementioned), or any combination thereof. The first semiconductor layer 234 may be a single layer or a multi-layer structure, and the material thereof may be amorphous silicon, polycrystalline silicon, microcrystalline silicon, monocrystalline silicon, organic semiconductor, oxide semiconductor, other proper materials, or any combination thereof. Take the material of the first semiconductor layer 234 according to one embodiment of the present invention as example, oxide semiconductor owns higher carrier mobility, lower growing temperature, and higher transparent in visible light range compared to amorphous silicon and polycrystalline silicon.

It should be understood that the materials of each layer mentioned above are only illustrative, and should not limit the invention. A person having ordinary skill in the art may select the materials of each layer according to actual requirements.

Figure 6:
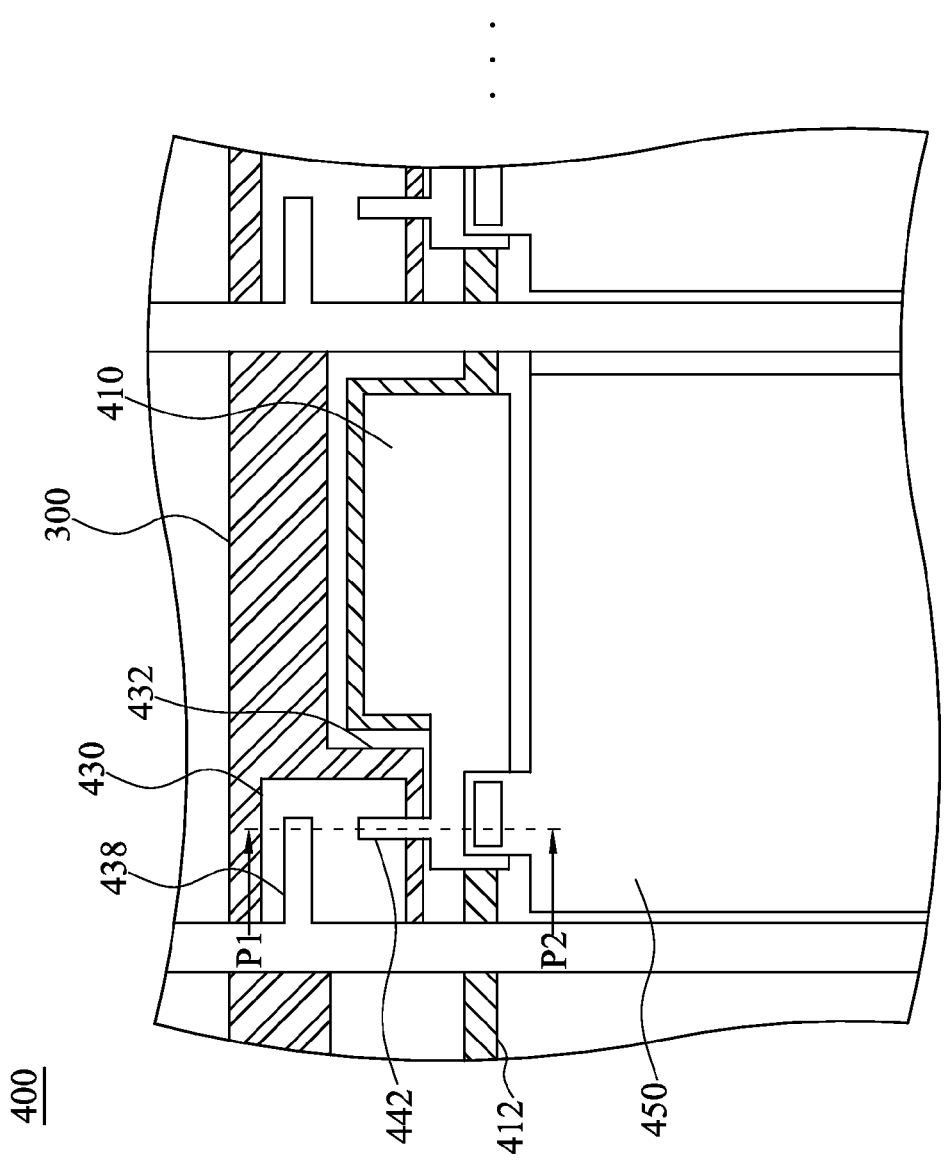
FIG. 6 is a top view of a pixel unit of FIG. 1.
Figure 7:
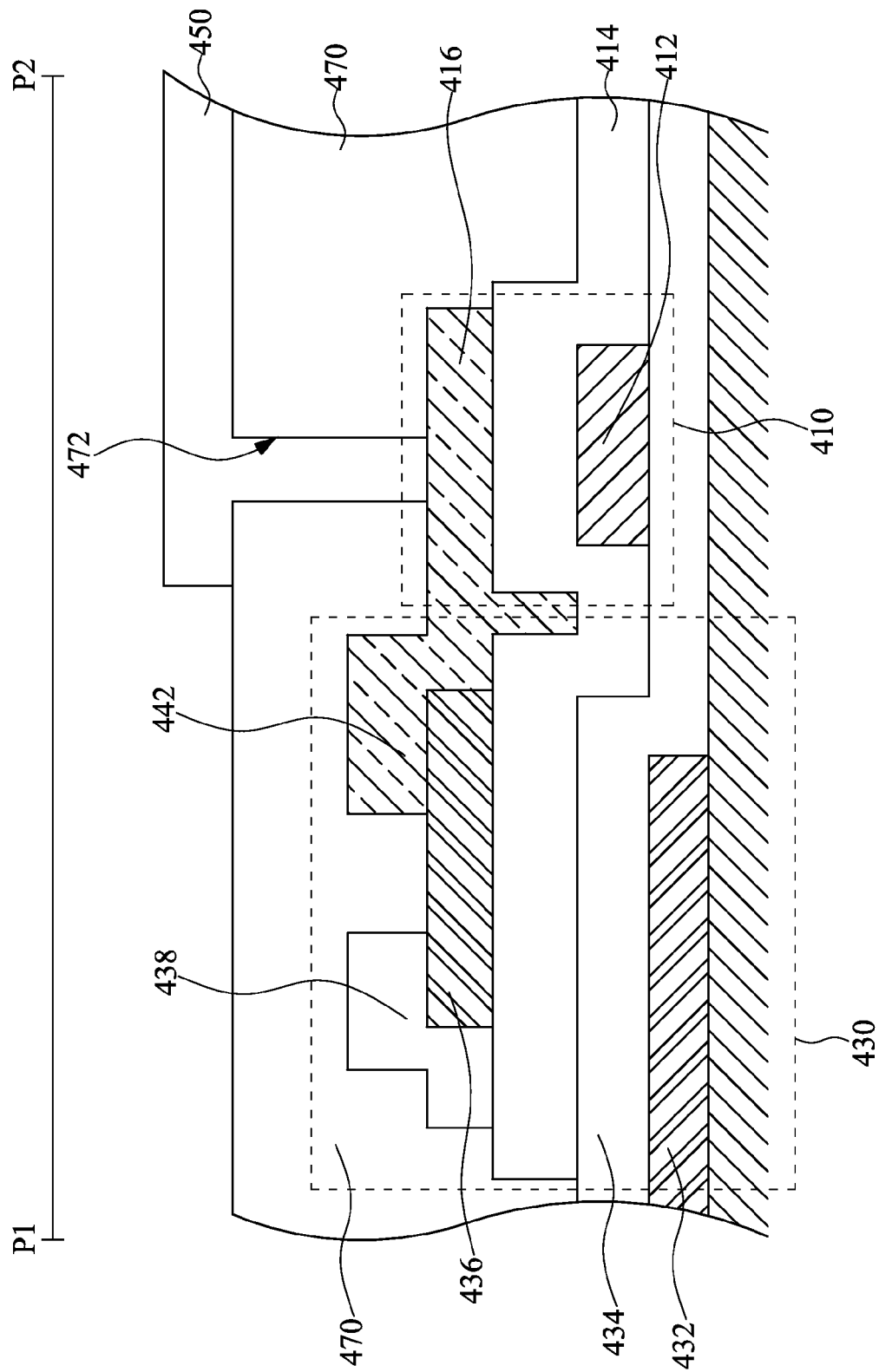
FIG. 7 is a cross-section view along line P1-P2 of FIG. 6.

FIG. 6 is a top view of a pixel unit 400 of FIG. 1, and FIG. 7 is a cross-section view along line P1-P2 of FIG. 6. The pixel unit 400 includes a pixel storage capacitor (or namely second capacitor) 410 and a pixel transistor (or namely second transistor) 430. In this embodiment, the pixel storage capacitor 410 and the pixel transistor 430 may be formed by using advanced super high aperture (ASHA) technique, but it should not limit the invention. In specifically, the pixel storage capacitor 410 includes a third electrode 412, a dielectric layer 414, and a fourth electrode 416. The third electrode 412 is for being as a bottom electrode of the pixel storage capacitor 410, and the fourth electrode 416 is for being as a top electrode of the pixel storage capacitor 410. The third electrode 412 and the second electrode 216 may be formed by the same third metal layer. However, the third electrode 412 is neither connected to the second electrode 216 nor the gate line 300. At least one portion of the dielectric layer 414 is disposed between the third electrode 412 and the fourth electrode 416. On the other hand, the pixel transistor 430 includes a pixel gate electrode (or namely gate electrode) 432, a pixel dielectric layer (or namely dielectric layer), a second semiconductor layer 436, a pixel source electrode (or namely source electrode) 438, and a pixel drain electrode (or namely drain electrode) 442. The pixel gate electrode 432 is connected to the gate line 300 of the display panel 100. The pixel dielectric layer is disposed between the pixel gate electrode 432 and the second semiconductor layer 436. In FIG. 7, the pixel dielectric layer includes a portion of a stack structure disposed between the pixel gate electrode 432 and the second semiconductor layer 436, where the stack structure includes a dielectric layer 434 and the dielectric layer 414. The pixel source electrode 438 and the pixel drain electrode 442 are disposed apart, and individually connected to the second semiconductor layer 436. The pixel drain electrode 442 is also connected to a pixel electrode 450 and the fourth electrode 416 of the pixel storage capacitor 410. The pixel source electrode 438 is also connected to a data line which is not marked. It should be noticed that the structures of the pixel storage capacitor 410 and the pixel transistor 430 are only illustrative, and should not limit the invention. A person having ordinary skill in the art may design proper structures of the pixel storage capacitor 410 and the pixel transistor 430 according to actual requirements. In addition, although the pixel transistor 430 of FIG. 6 is a bottom-gate-type transistor, the pixel transistor 430 may be a top-gate-type transistor, i.e. the pixel gate electrode 432 is disposed above the second semiconductor layer 436, in other embodiments.

In one or more embodiments, the pixel storage capacitor 410 may be disposed on the dielectric layer 434, but the pixel storage capacitor 410 does not overlap the pixel gate electrode 432. References are made to FIG. 4 and FIG. 7. The pixel gate electrode 432, the gate line 300, and the first electrode 212 may be all made of the first metal layer. The pixel source electrode 438, the pixel drain electrode 442, the fourth electrode 416 of the pixel storage capacitor 410, the source electrode 236 of the driving transistor 230, and the drain electrode 238 of the driving transistor 230 may be all made of the second metal layer. The dielectric layer 434 may be formed with the first dielectric layer 214. The dielectric layer 414 may be formed with the second dielectric layer 232, and at least one portion of the dielectric layer 414 may cover the dielectric layer 434. The first semiconductor layer 234 of the driving transistor 230 and the second semiconductor layer 436 of the pixel transistor 430 may, preferred, be both made of a semiconductor layer, such that the fabrication process is relatively simple. However, the materials of the first semiconductor layer 234 and the second semiconductor layer 436 may be different. Therefore, since the distance of the third electrode 412 and the fourth electrode 416 of the pixel storage capacitor 410 is shorter than that of the traditional storage capacitor, the area of the pixel storage capacitor 410 may be reduced, and the aperture ratio of the display panel 100 can be improved. It should be understood that the structure of each layer mentioned above are only illustrative, and should not limit the invention. A person having ordinary skill in the art may design proper structures of each layer according to actual requirements.

On the other hand, the pixel unit 400 selective includes a passivation layer 470 covering the pixel transistor 430 and the pixel storage capacitor 410 for protecting the pixel transistor 430 and the pixel storage capacitor 410. The passivation layer 470 may have a through hole 472, and the pixel electrode 450 of the pixel unit 400 may be connected to the pixel drain electrode 442 and the fourth electrode 416 of the pixel storage capacitor 410 via the through hole 472, but it should not limit the invention. In addition, the materials of each layer of the pixel unit 400 may have the same or different materials as the materials used in the driving storage capacitor 210 and the driving transistor 230.

Reference is made back to FIG. 2. In one or more embodiments, the gate driving circuit 200 may further include a scan sequence signal generation 250 for providing a scan sequence signal to the gate driving circuit 200 if the display panel 100 includes a plurality of gate lines 300. On the other hand, the gate driving circuit 200 may further include a first clock 270 and a second clock 290. The first clock 270 is connected to the drain electrode 238 of the driving transistor 230, and the second clock 290 is connected to the source electrode 236 of the driving transistor 230. The signals generated from the first clock 270 and the second clock 290 are in different phases. In one or more embodiments, the phase difference between signal generated from the first clock 270 and the signal generated from the second clock 290 can be selected to be 180 degrees. In other words, the source electrode 236 of the driving transistor 230 is not only connected to the gate line 300 and the first electrode 212, i.e. the electrode of the driving storage capacitor 210, but also connected to the second clock 290. It should be understood that the elements of the gate driving circuit 200 are only illustrative, and should not limit the invention. A person having ordinary skill in the art may select proper elements of the gate driving circuit 200 according to actual requirements.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A display panel having a display area and a gate driving area, comprising:
at least one gate line and a plurality of pixel units disposed in the display area, wherein the gate line is connected to the pixel units; and
a gate driver circuit disposed in the gate driving area and connected to the gate line, the gate driving circuit comprising a driving transistor and a driving storage capacitor stack to each other to form a stack structure, the stack structure comprising:
a first electrode connected to the gate line for being as a bottom electrode of the driving storage capacitor;
a first dielectric layer;
a second electrode, at least one portion of the second electrode overlapping the first electrode, and at least one portion of the first dielectric layer disposed between the second electrode and the first electrode, the second electrode for being as a gate electrode of the driving transistor and a top electrode of the driving storage capacitor, wherein the driving storage capaci- tor is formed by the first electrode, the first dielectric layer, and the second electrode;

a second dielectric layer;

a first semiconductor layer, at least one portion of the first semiconductor layer overlapping the second electrode, and at least one portion of the second dielectric layer disposed between the second electrode and the first semiconductor layer; and a source electrode and a drain electrode disposed apart from each other, and connected to the first semiconductor layer respectively, wherein the source electrode is connected to the gate line, and the driving transistor is formed by the second electrode, the first semiconductor layer, the source electrode, and the drain electrode.

2. The display panel of claim 1, wherein the second electrode is disposed above the first electrode, and the first semiconductor layer is disposed above the second electrode.

3. The display panel of claim 1, wherein the second electrode is disposed above the first semiconductor layer, and the first electrode is disposed above the second electrode.

4. The display panel of claim 1, wherein the gate line and the first electrode are both composed by a first metal layer, the source electrode of the driving transistor and the drain electrode of the driving transistor are both composed by a second metal layer, and the second electrode is composed by a third metal layer.

5. The display panel of claim 4, wherein the third metal layer is disposed between the first metal layer and the second metal layer.

6. The display panel of claim 1, wherein each of the pixel units comprises a pixel transistor and a pixel storage capacitor connected to each other, and the pixel storage capacitor comprises:

a third electrode, wherein the third electrode and the second electrode are both composed by a third metal layer without connecting to each other;

a fourth electrode; and a dielectric layer disposed between the third electrode and the fourth electrode.

7. The display panel of claim 6, wherein the fourth electrode of the pixel storage capacitor, the source electrode of the driving transistor, and the drain electrode of the driving transistor are all composed of a second metal layer.

8. The display panel of claim 6, wherein the pixel transistor comprises:

a pixel gate electrode connected to the gate line;

a second semiconductor layer;

a pixel dielectric layer disposed between the pixel gate electrode and the second semiconductor layer; and a pixel source electrode and a pixel drain electrode disposed apart from each other and connected to the second semiconductor layer respectively, wherein the pixel drain electrode is connected to the fourth electrode of the pixel storage capacitor.

9. The display panel of claim 8, wherein the pixel gate electrode, the gate line, and the first electrode are all composed by a first metal layer.

10. The display panel of claim 8, wherein the pixel source electrode, the pixel drain electrode, the fourth electrode of the pixel storage capacitor, the source electrode of the driving transistor, and the drain electrode of the driving transistor are all composed by a second metal layer.

11. The display panel of claim 8, wherein the first semiconductor layer of the driving transistor and the second semiconductor layer of the pixel transistor are both composed by a semiconductor layer.

12. The display panel of claim 8, wherein the pixel drain electrode of the pixel transistor is further connected to a pixel electrode.

13. The display panel of claim 1, wherein the gate driving circuit further comprises a scan sequence signal generation for providing a scan sequence signal of the gate driving circuit.

14. The display panel of claim 13, wherein the gate driving circuit further comprises a first clock and a second clock, wherein the first clock is connected to the drain electrode of the driving transistor, and the second clock is connected to the source electrode of the driving transistor.

15. The display panel of claim 14, wherein the phase difference between the signal of the first clock and the signal of the second clock is 180 degrees.

* * * * *